United States Patent
Mabuchi

(10) Patent No.: US 8,513,710 B2
(45) Date of Patent: Aug. 20, 2013

(54) SOLID-STATE IMAGING DEVICE AND CONTROL METHOD FOR SAME

(75) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 801 days.

(21) Appl. No.: 10/684,939

(22) Filed: Oct. 14, 2003

(65) Prior Publication Data

US 2004/0130757 A1 Jul. 8, 2004

(30) Foreign Application Priority Data

Oct. 17, 2002 (JP) ................................ P2002-302873

(51) Int. Cl.
 *H01L 27/146* (2006.01)

(52) U.S. Cl.
 USPC .... 257/223; 257/230; 257/292; 257/E27.132; 348/E3.018

(58) Field of Classification Search
 USPC .................. 257/292, 291, E27.132, 223, 230; 348/E3.018
 See application file for complete search history.

(56) References Cited

U.S. PATENT DOCUMENTS

| | | | | |
|---|---|---|---|---|
| 5,008,758 | A | * | 4/1991 | Burke ........................... 348/243 |
| 5,115,458 | A | * | 5/1992 | Burkey et al. .................. 377/58 |
| 6,566,697 | B1 | * | 5/2003 | Fox et al. ....................... 257/292 |
| 6,624,456 | B2 | * | 9/2003 | Fossum et al. ................. 257/292 |
| 6,674,471 | B1 | * | 1/2004 | Masuyama .................... 348/312 |
| 2001/0012133 | A1 | * | 8/2001 | Yoneda et al. ................. 358/482 |
| 2002/0109160 | A1 | * | 8/2002 | Mabuchi et al. .............. 257/233 |

FOREIGN PATENT DOCUMENTS

| | | |
|---|---|---|
| JP | 04-281681 | 10/1992 |
| JP | 09-051480 | 2/1997 |
| JP | 09051480 | 2/1997 |
| JP | 1164210 | 6/1999 |
| JP | 11-195778 | 7/1999 |
| JP | 11195778 | 7/1999 |
| JP | 11-224941 | 8/1999 |
| JP | 2001-078098 | 3/2001 |
| JP | 2001-197368 | 7/2001 |
| JP | 2001197368 | 7/2001 |
| JP | 2001-238132 | 8/2001 |
| JP | 2001238132 | 8/2001 |

(Continued)

OTHER PUBLICATIONS

Japanese Office Action issued on Dec. 19, 2007 in connection with Japanese Patent Application No. 2002-302873.

(Continued)

*Primary Examiner* — John C Ingham
(74) *Attorney, Agent, or Firm* — Dentons US LLP

(57) ABSTRACT

In realizing an entire-screen simultaneous shutter function using a solid-state imaging device having a device structure as a CMOS solid-state imaging device, the restriction undergone by exposure time is relieved to secure a sufficient exposure time with swift operation. Separately from a transfer Tr for transferring a signal charge of a buried-type PD to an FD, a drain Tr is provided to exclude a signal charge of the buried PD. Both a channel potential on the drain transistor when turned on and a channel potential on the transfer transistor when turned on are set higher than a depleting potential for the PD. This makes it possible to completely transfer the signal charge of the PD by both the transfer Tr and the drain Tr. In the operation to sequentially read out a signal charge from the FD on a pixel-row basis, PD exposure operation is started in a course of reading out the same.

23 Claims, 9 Drawing Sheets

(56) References Cited

FOREIGN PATENT DOCUMENTS

| JP | 2001-257943 | 9/2001 |
|---|---|---|
| JP | 2001-292374 | 10/2001 |
| JP | 2002-064751 | 2/2002 |
| JP | 2002064751 | 2/2002 |
| JP | 2002134729 | 5/2002 |
| JP | 2002-198505 | 7/2002 |
| JP | 2002198505 | 7/2002 |
| JP | 2002300589 | 10/2002 |
| JP | 2004140149 | 5/2004 |

OTHER PUBLICATIONS

Japanese Office Action for Japanese counterpart JP Application No. 2008-035801 dated Dec. 25, 2012.

* cited by examiner

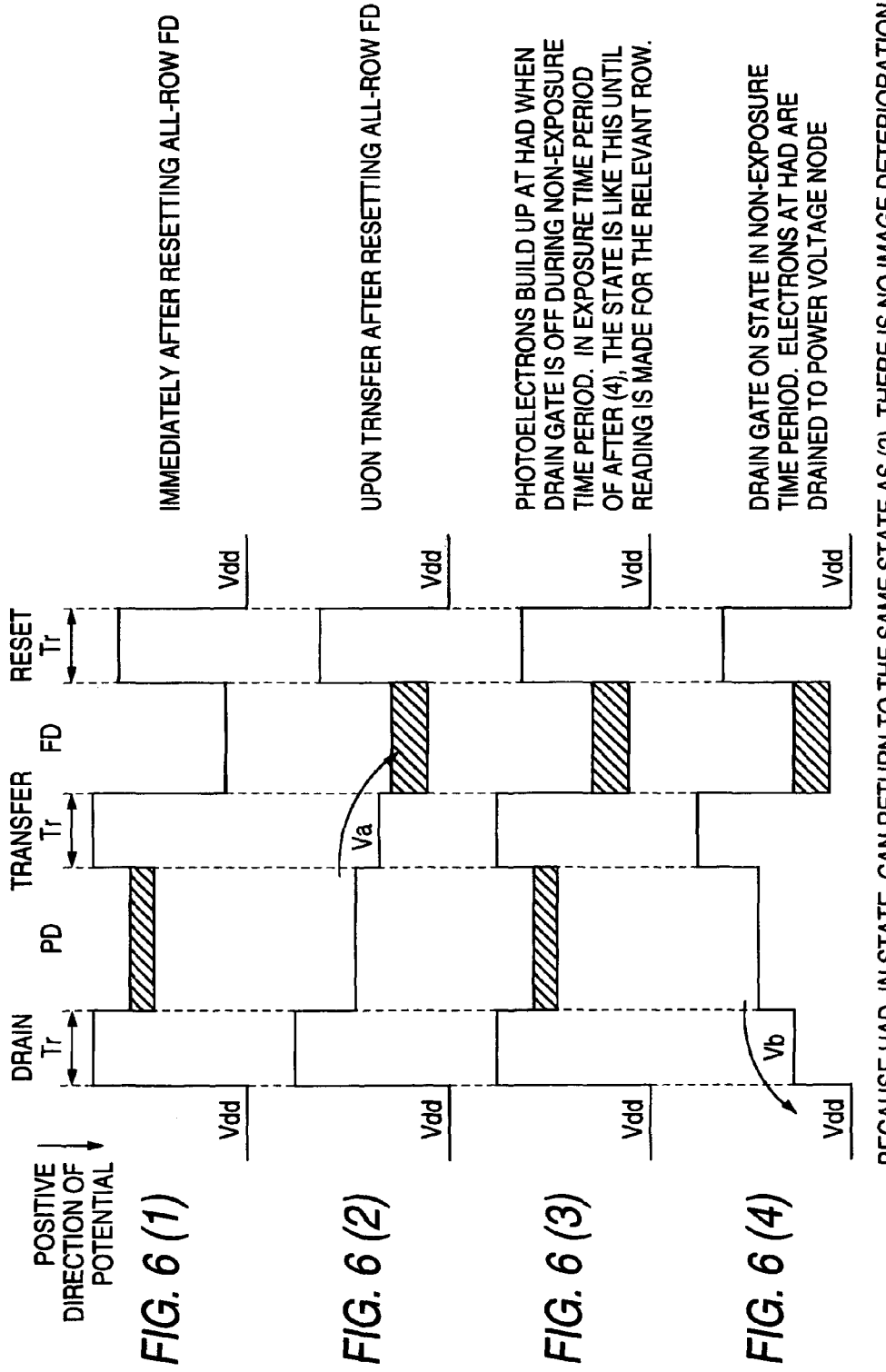

FOCAL-PLANE SHUTTER

PHOTOGRAPHIC IMAGE WHEN SHOOTING VERTICALLY STRAIGHT OBJECT MOVING SIDEWAYS

ENTIRE-SCREEN SHUTTER

PHOTOGRAPHIC IMAGE WHEN SHOOTING VERTICALLY STRAIGHT OBJECT MOVING SIDEWAYS

SOLID-STATE IMAGING DEVICE AND CONTROL METHOD FOR SAME

RELATED APPLICATION DATA

The present application claims priority to Japanese Application(s) No(s). P2002-302873 filed Oct. 17, 2002, which application(s) is/are incorporated herein by reference to the extent permitted by law.

BACKGROUND OF THE INVENTION

1. Technical Field of the Invention

The present invention relates to a solid-state imaging device, such as a CMOS image sensor, having an electronic shutter function, and to a control method for same.

2. Description of the Related Art

Conventionally, the CMOS image sensors mostly have electronic shutter functions. Differently from the CCD image sensors, because of the use of a focal plane shutter (rolling shutter) to reset the signals on a pixel-row basis by sequentially scanning a multiplicity of pixels arranged two-dimensional, there is a problem that exposure time deviates between the rows on the screen.

In this case, when shooting a vertically straight object moving in a horizontal direction, it comes out as if it were inclined.

FIG. 7A is an explanatory figure illustrating such a situation. After resetting the rows, the operation for transfer output (signal reading) is sequentially made on each row after a predetermined exposure time. As a consequence, the image obtained has a vertically straight object a moving sideways taken in an inclined state, as shown in FIG. 7C for example.

On the contrary, there exist those allowing shuttering on all the rows at the same time. In such a case, photodiodes (PDs) are reset simultaneously over all the rows at a certain point of time. After a predetermined exposure time, the charges on the PDs are transferred, simultaneously at all the rows, to a floating diffusion (FD). The FD signals are outputted row by row in the order.

FIG. 7B is an explanatory figure illustrating a situation like that. After resetting all the rows in batch, simultaneous transfer is done on all the rows, followed by an output on a row-by-row basis. By doing so, even in the case of shooting a vertical straight object a moving horizontally, it can be taken straight as it is as shown in FIG. 7D.

Meanwhile, there is a proposal having a transistor (drain Tr) capable of excluding PD extra charge directly onto the drain without passing through the FD, as a pixel circuit configuration for simultaneously resetting, with signal charge, the photodiodes (PDs) of all the pixels on a CMOS image sensor (see Patent Document 1).

[Patent Document 1]
JP-A-2001-238132

However, the CMOS image sensor in the all-the-pixel shutter scheme shown in FIG. 7B involves the following problems.

(1) In the duration of after a simultaneous transfer over all the rows and before a sequential output on a pixel-row basis, light might leak to the FD the amount of which is different between the rows to be outputted earlier and to be outputted later. This results in a worsened photographic image.

(2) Because the PDs are reset after outputting the information of all the rows, exposure is impossible in a duration from a simultaneous transfer over all the rows to a completion of outputting row by row the information of all the rows. This spends time uselessly. Meanwhile, because of difficulty in taking an exposure time period great, the sensitivity lowers where the subject is dark.

These problems are explained below in greater detail.

At first, as for the above (1), there is a difference of one frame-reading time between the row to be outputted at the head and the row to be outputted at the last, in respect of the time length from a transfer to an output. The amount of a leak light to the FD is nearly zero on the head row whereas the amount of a leak light on the last row amounts to one frame-reading time period.

Photoelectric conversion is effected also at the FD, to build up charges at the FD in an amount corresponding to that light amount. This charge is added to the signal charge transferred from the PD.

This results in, besides noise or shading, exceeding the amount of saturation signal to cause white skipping in the case of intense light. In this manner, the leak of light to the FD considerably worsens the photographic image.

In this relation, explanation is made with using FIGS. 8 and 9. FIG. 8 is a sectional view showing a structure of a photodiode peripheral part of the prior-art CCD solid-state imaging device.

The CCD solid-state imaging device has a photodiode (PD) 12, a reading channel part 14, a channel stop part 16, a vertical transfer register 18 and the like, formed in an upper layer region of a semiconductor substrate 10. A polysilicon transfer electrode 22 is arranged on an upper surface of the semiconductor substrate 10 through a gate insulation film 20, on which a shade film 26 is further arranged through an insulation film 24.

In the shade film 26, an opening 26A is formed corresponding to a light-receiving surface of the PD 12. Meanwhile, a planarizing film (upper-layered insulation film) 28 is formed on the shade film 26, on which a color filter 30 and micro-lens 32 is fitted.

In the CCD solid-state imaging device thus configured, the photoelectric charge on the PD 12 is read out simultaneously over the entire screen, and transferred to a vertical transfer register 18 through the reading channel part 14.

Thereafter, the photoelectric charge is conveyed row by row to an output amplifier (not shown) by the CCD of the vertical transfer register 18, then being outputted.

As shown in the figure, on the CCD solid-state imaging device, a metal layer of aluminum or the like to serve as a shade film 26 is formed extending down to an immediate vicinity of the PD 12, to prevent light from leaking to the vertical transfer register 18. Nevertheless, a slight part of light leaks to the vertical transfer register 18. This is responsible for the image deterioration in a vertical-line form, called smear.

FIG. 9 is a sectional view showing a construction of a photodiode peripheral part of the prior-art CMOS solid-state imaging device.

This CMOS solid-state imaging device has P-well regions 42, 44 as a device region formed in an upper-layered part of a semiconductor substrate (N-type silicon substrate) 40, to form a PD 46 and various gate elements in the P-well regions 42, 44. Note that, in the illustrated example, the P-well region 42 is formed therein with a PD 46, a transfer gate (MOS transistor) 48 and an FD 50 while the P-well region 44 is with a MOS transistor 52 of the peripheral circuit section.

Meanwhile, in the above of the semiconductor substrate 40, a polysilicon transfer electrode 56 of each gate is formed through a gate insulation film 54. In the upper layer than that, multi-level wiring layers 60, 62, 64 are formed through an interlayer insulation film 58. Of the multi-level wiring layers, the uppermost-layered film 64 is formed as a shade film.

Meanwhile, on the multi-level wiring layers, a color filter 72 and micro-lens 74 is arranged through a protection film (SiN) 70.

In this manner, in the CMOS solid-state imaging device, pixels are made by the use of a CMOS process similarly to the peripheral circuits, making it impossible to make a shade film (wiring layer 64) extending down to an immediate vicinity of the PD 46. Thus, it is impossible to fabricate a structure allowing light to enter only the PD 46.

Furthermore, because the metal wiring layer exists in plurality of layers, light is to be irregularly reflected upon the layers. For this reason, a great deal of light is to leak to the FD 50 as compared to the case of a CCD solid-state imaging device, as can be understood from FIG. 9.

Thus, the CMOS solid-state imaging device involves a problem that image deterioration is serious upon simultaneous transfer on all the rows.

Next, as for the above (2), resetting the PD is by draining the charge of the PD to the FD. At this time, in case the FD is in a signal holding state, the signal is to be destroyed. Consequently, PD resetting is possible only after all the rows of FD signal have been read out.

For this reason, there exists a CMOS sensor having a transistor (drain Tr) capable of draining PD extra charge directly to the drain without passage through the FD, as disclosed in the foregoing Patent Document 1. However, this still requires PD resetting via the FD. Unless the PD is reset after reading FD signals on all the rows, image deterioration results.

This is because of the following reason. Namely, because it is impossible to completely match the characteristics, such as threshold, between the transfer Tr for transferring PD charge to the FD and the drain Tr mentioned in the above. In case the PD is reset in the beginning of a storage time period by the drain Tr, the PD is not return to the reset state when transferring charge to the FD in the end of the storage time period by the transfer Tr. The difference might cause problems, such as fixed-pattern noise and afterimage, not to be removed by the later-processing circuit.

Accordingly, in order to obtain a preferred image, PD reset is not allowed before the FD signal has been read out on all the rows. Because no exposure time is available, sensitivity is lowered.

Furthermore, it has been revealed that, in case the PD is reset in a course of FD signal reading by the drain Tr, there encounters a delicate difference between the pixel status before and after resetting the PD thereby causing a problem that a horizontal line is seen in a relevant part of a photographic image.

Meanwhile, it has been also revealed that, in the presence of a drain Tr, there also encounters a problem that a dark current occurs at an oxide film interface in the beneath thereof which flows into the PD.

Therefore, it is an object of the present invention to provide a solid-state imaging device capable of relieving the restrictions on exposure time period, securing a sufficient exposure time period on swift operation, relatively reducing the noise amount due to light leak, and outputting a suitable image, in the case of realizing an entire-screen simultaneous shutter function by the use of a solid-state imaging device having such a device structure as the foregoing CMOS solid-state imaging device, and a controlling method for the same.

SUMMARY OF THE INVENTION

The present invention, for achieving the foregoing object, is a solid-state imaging device having an imaging region section provided with a plurality of pixels and a processing circuit section for processing an image signal outputted from the imaging region section, the solid-state imaging device comprising: the pixel having a photoelectric converting element for generating a signal charge commensurate with a light-receiving amount, a floating diffusion part for detecting an amount of a signal charge generated by the photoelectric converting element, a transfer transistor for transferring a signal charge generated by the photoelectric converting element to the floating diffusion part, and a drain transistor for draining a signal charge generated by the photoelectric converting element; the photoelectric converting element being formed by a buried photodiode having a charge separating region formed by a first conductivity type high-concentration impurity layer in an extreme surface of a semiconductor substrate and a charge storing region formed by a second conductivity type impurity layer in a layer beneath the charge separating region; both a channel potential on the drain transistor being turned on and a channel potential on the transfer transistor being turned on being set higher than a potential for depleting the photodiode.

Meanwhile, the present invention is a control method for a solid-state imaging device having an imaging region section provided with a plurality of pixels and a processing circuit section for processing an image signal outputted from the imaging region section, wherein the pixel has a photoelectric converting element for generating a signal charge commensurate with a light-receiving amount, a floating diffusion part for detecting an amount of a signal charge generated by the photoelectric converting element, a transfer transistor for transferring a signal charge generated by the photoelectric converting element to the floating diffusion part, and a drain transistor for draining a signal charge generated by the photoelectric converting element; the photoelectric converting element being formed by a buried photodiode having a charge separating region formed by a first conductivity type high-concentration impurity layer in an extreme surface of a semiconductor substrate and a charge storing region formed by a second conductivity type impurity layer in a layer beneath the charge separating region; the control method for a solid-state imaging device comprising: setting both a channel potential on the drain transistor being turned on and a channel potential on the transfer transistor being turned on higher than a potential for depleting the photodiode; and enabling to completely transfer the signal charge of the photodiode through both the transfer transistor and the drain transistor, and starting an exposure operation on the photodiode in a course of reading of the signal charge from the floating diffusion part.

Meanwhile, the present invention is a camera apparatus for outputting an image taken by a solid-state imaging device, the camera apparatus comprising: the solid-state imaging device having an imaging region section provided with a plurality of pixels and a processing circuit section for processing an image signal outputted from the imaging region section, the pixel having a photoelectric converting element for generating a signal charge commensurate with a light-receiving amount, a floating diffusion part for detecting an amount of a signal charge generated by the photoelectric converting element, a transfer transistor for transferring a signal charge generated by the photoelectric converting element to the floating diffusion part, and a drain transistor for draining a signal charge generated by the photoelectric converting element; the photoelectric converting element being formed by a buried photodiode having a charge separating region formed by a first conductivity type high-concentration impurity layer in an extreme surface of a semiconductor substrate and a charge storing region formed by a second conductivity type impurity layer in a layer beneath the charge separating region;

both a channel potential on the drain transistor being turned on and a channel potential on the transfer transistor being turned on being set higher than a potential for depleting the photodiode.

BRIEF DESCRIPTION OF THE DRAWINGS

FIG. 6 is an explanatory figure showing the potential transition during charge reading on the solid-state imaging device shown in FIG. 2;

DESCRIPTION OF THE PREFERRED EMBODIMENTS

Now, explanation will be made on the embodiments of a solid-state imaging device, a camera apparatus and a control method for the same according to the invention.

The present embodiment is of a device structure that a CMOS solid-state imaging device has a drain gate and a transfer gate provided on the respective sides of a PD thereof. The charge stored on the PD can be completely reset/transferred at both the drain and transfer gates, thereby enabling to start a storage in a course of reading a signal of the FD.

Meanwhile, dark current can be prevented by applying a negative voltage to the drain and transfer gates.

Figure 1:
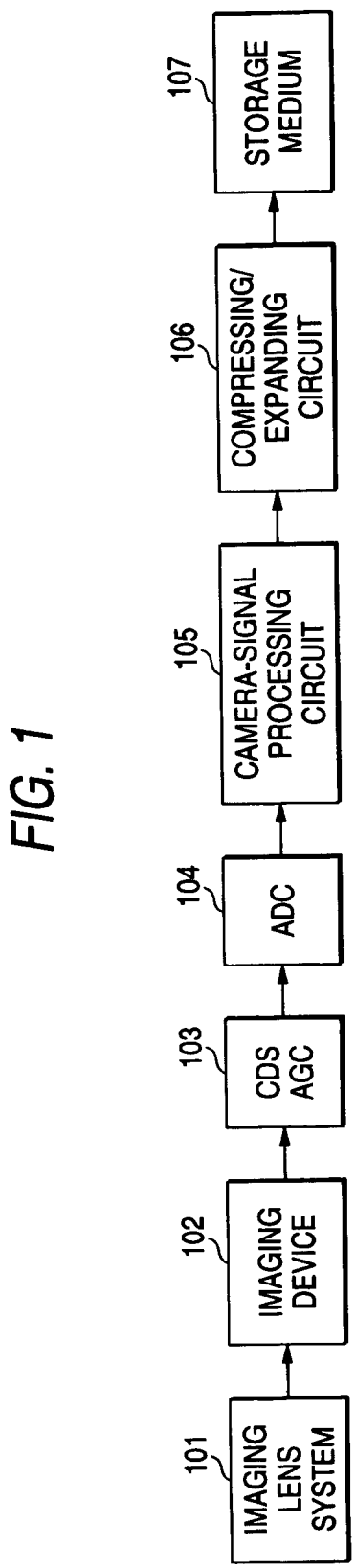
FIG. 1 is a block diagram showing a configuration example of a camera system in an embodiment of the present invention.

FIG. 1 is a block diagram showing a configuration example of a camera system according to the embodiment of the present invention.

The camera system includes an imaging lens system 101, a solid-state imaging device 102, an analog circuit 103, an A/D converter 104, a camera signal processing circuit 105, a compressing/expanding circuit 106 and a storage medium 107.

At first, the rays of light incident upon the imaging lens system 101 are focused on a two-dimensional pixel array of the solid-state imaging device 102. The solid-state imaging device 102, a device such as a CMOS image sensor, has an all-the-pixel simultaneous shutter function (reset/transfer at FD) and a row sequential reading function from the FD constituting the features of the present embodiment.

The analog circuit 103 carries out a process, such as CDS (correlated double sampling) and AGC (automatic gain control). The image signal processed by the analog circuit 103 is converted from analog data into digital data by the A/D converter 104, then being outputted to the camera signal processing circuit 105.

The camera signal processing circuit 105 carries out a signal process, such as color signal processing for conversion from output data of the solid-state imaging device 102 into a video signal, gain control processing and white-balance processing.

The compressing/expanding circuit 106 makes a compression or expansion on the image data processed by the camera signal processing circuit 105 and transforms the image into a format to be stored to the storage medium 107. The storage medium 107 is a memory stick, for example, which is an example of means for outputting image data. This may be a display panel, a network in various kinds, or the like.

Figure 2:
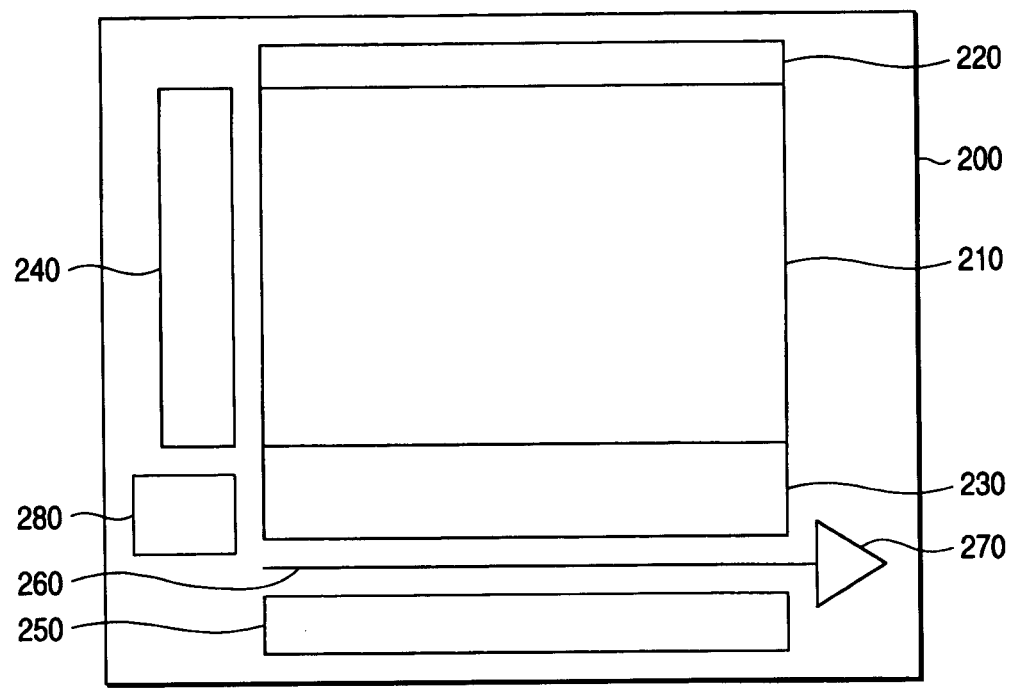
FIG. 2 is a block diagram showing a configuration example of a solid-state imaging device and analog circuit of a camera system shown in FIG. 1.

FIG. 2 is a block diagram showing a configuration example of the solid-state imaging device 102 and analog circuit 103 shown in FIG. 1.

As shown in the figure, the solid-state imaging device of this embodiment has a pixel section (imaging region) 210, a constant current section 220, a column signal processing section (column section) 230, a vertical (V) selection drive means 240, a horizontal (H) selection drive means 250, a horizontal signal line 260, an output processing section 270 and a timing generator (TG) 280 and so on, provided on a semiconductor device substrate 200.

Figure 3:
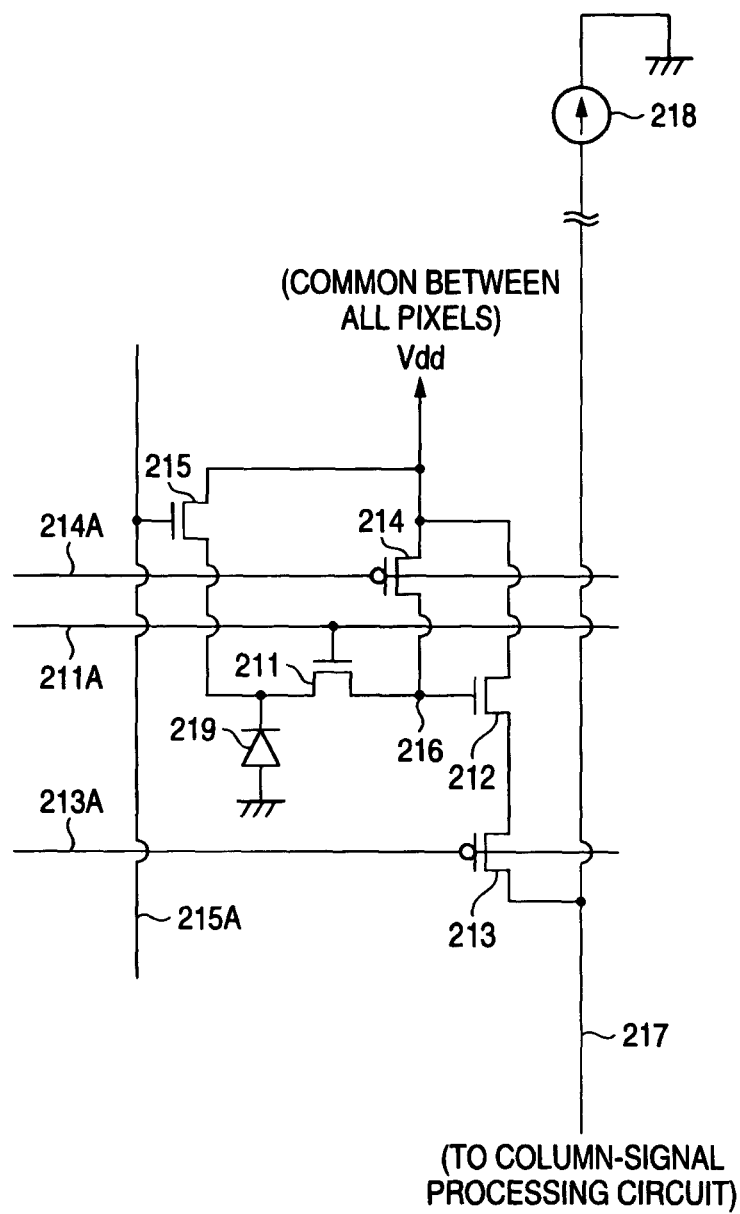
FIG. 3 is a circuit diagram showing a configuration example of a pixel circuit provided on each pixel of the solid-state imaging device shown in FIG. 2.

The pixel section 210 is arranged with a multiplicity of pixels in a two-dimensional matrix form, wherein a pixel circuit as shown in FIG. 3 is provided for each pixel. The pixel signals from the pixel section 210 are outputted, on a pixel column basis, to a column signal processing section 230 through a vertical signal line (omitted in FIG. 2).

The constant current section 220 is arranged therein with constant current sources (omitted in FIG. 2) for supplying bias currents to the pixels, on a pixel column basis.

The V-selection drive means 240 selects, row by row, the pixels of the pixel section 210, to drive-control the shutter operation and reading operation of the pixels.

The column signal processing section 230 receives pixel signals, in an amount of one row a time, obtainable through the vertical signal line and carries out a predetermined signal process column by column, to temporarily hold the signal. For example, it is assumed that properly carried out a CDS (removing fixed pattern noise caused by the threshold variations between the pixel transistors) process, an AGC (auto gain control) process and an A/D conversion process.

The H-selection drive means 250 selects, one by one, a signal of the column signal processing section 230 and directs it onto the horizontal signal line 260.

The output processing section 270 makes a predetermined process on the signal from the horizontal signal line 260 and outputs it to the external, e.g. having a gain control circuit and a color processing circuit. Incidentally, A/D conversion may be by the output processing section 270 in place of the column signal processing section 230.

The timing generator 280 supplies various pulse signals and the like required to operate the sections, on the basis of a reference clock.

FIG. 3 is a circuit diagram showing a configuration example of a pixel circuit provided on each pixel of the solid-state imaging device shown in FIG. 2.

The shown configuration is a provision of a photodiode (PD) 219 and five pixel transistors (Trs) 211, 212, 213, 214, 215 of transfer, amplification, selection, reset and drain, on each pixel.

The PD 219 is to store electrons caused due to photoelectric conversion. By turning on the transfer Tr 211, the electron on the PD 219 is transferred to the floating diffusion (FD) 216. Because the FD 216 possesses a parasitic capacitance, photoelectrons are reserved there.

The amplifying Tr 212 has a gate connected to the FD 216, to convert a potential change on the FD 216 into an electric signal. The selecting Tr 213 selects, row by row, the pixels from which signals are to be read. When the selecting Tr 213 is turned on, the amplifying Tr 212 mates with a constant current source 218 connected outside the pixel to the vertical signal line 217, into a source-follower circuit. Thus, the voltage interactive with a voltage on the FD 216 is outputted onto the vertical signal line.

The reset Tr 214 resets the Vdd wiring with a potential of the FD 216.

The drain Tr 215 resets the power Vdd wiring directly with a photoelectron on the PD 219. The power Vdd wiring is common between all the pixels.

Meanwhile, the wirings 211A, 213A, 214A for the transfer Tr 211, selecting Tr 213 and reset Tr 214 extend sideways (horizontally=in row direction), to simultaneously drive the pixels included on the same row. This can cope also with driving a focal plane shutter.

Meanwhile, although the wiring 215A for the drain Tr 215 extends vertically, it is short-circuited at the upper and lower ends of the pixel section and hence made common between all the pixels.

The PD 219 employs a buried type PD. The buried type PD, if it is a photodiode in a P-well for example, has a p+ type region nearby the interface of a gate oxide film and an n type region formed in the beneath thereof. Because the interface is covered with the p+ region, dark current can be prevented from occurring at the interface.

Meanwhile, the transfer Tr 211 and the PD 219, if suitably designed, makes it possible to transfer all the photoelectrons of the PD 219 to the FD 216. This is the structure broadly used on the CCD-type sensors, e.g. marketed as a product dubbed HAD (Hole Accumulation Diode).

In the CMOS solid-state imaging device thus configured, the present embodiment is characterized in that the gate voltage and threshold of the Tr 211, 215 as well as the dose to the PD 219 are adjusted such that the channel potentials on the turned-on drain Tr 215 and turned-on transfer Tr 211 are both higher than a potential for depleting the buried-type PD 219.

Due to this, the transfer Tr 211 is allowed to transfer nearly all the photoelectrons of the PD 219 to the FD 216 while the drain Tr 215 is allowed to exclude nearly all the photoelectrons of the PD 219 onto the drain.

Note that, because, in the case of an image for viewing by the human, e.g. a digital camera, the remaining electrons are satisfactorily about 20 or less, then "nearly completely" is meant to include the case to cause such remaining electrons.

Generally, there is a difficulty in providing, on one buried PD, two Trs both with characteristics for nearly complete transfer. Meanwhile, there are already existing those having a transfer Tr enabling nearly complete transfer. For this reason, the present embodiment realizes nearly complete transfer by raising the gate voltage of the drain Tr 215 during on higher than that of the transfer Tr 211.

Particularly, this is preferably given higher than a power voltage of a digital circuit fabricated with the solid-state imaging device on one chip. Consequently, realization is possible by supplying another power from the external of the solid-state imaging device or internally providing a booster circuit.

Meanwhile, the present inventors have proposd that, in the solid-state imaging device of the above configuration, by applying a negative voltage (referred herein to as a transfer bias voltage) of −1V during off of the transfer gate electrode, dark current (current having a component of electrons to flow to the PD even in the absence of incident light) be suppressed from occurring at the interface beneath the transfer gate part.

This is because, by biasing the transfer gate electrode toward a negative voltage, a P-type channel is formed at the interface of a gate oxide film in the transfer gate part, thereby preventing a dark current from an interfacial level similarly to the buried PD.

Accordingly, the present embodiment applies a negative voltage to the transfer Tr gate electrode and, likewise, a negative voltage also to the drain Tr gate electrode (referred herein to as a drain bias voltage), thereby properly eliminating the both Trs of dark current. Note that a reference 0V is GND while the P-well region is rendered 0V.

It has been confirmed by the actual measurement that, by thus applying a negative voltage to the drain Tr gate electrode, obtained is the effect equivalent to the case of applying a negative voltage to the transfer Tr gate electrode.

Now, the operation is explained of the solid-state imaging device according to the present embodiment.

Figure 4:
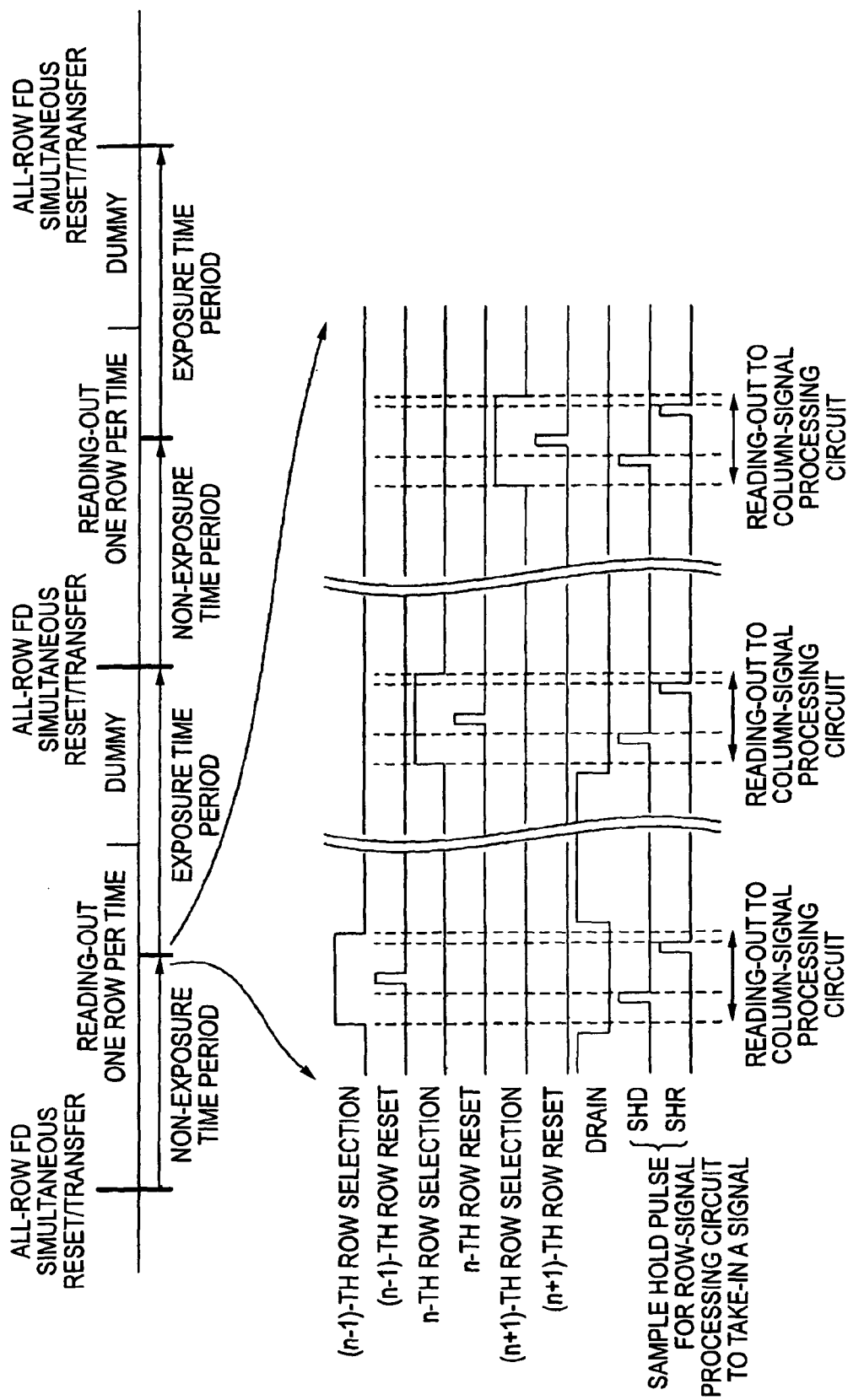
FIG. 4 is a timing chart showing the operation of the solid-state imaging device shown in FIG. 2.

FIG. 4 is a timing chart showing the operation of the solid-state imaging device of this embodiment.

At first, the FD 216 is reset and the photoelectrons of the PD 219 is transferred to the FD 216, simultaneously over all the rows. Specifically, for example, a pulse is fed to the reset wirings 214A on all the rows, to reset the FDs 216 of all the pixels. Furthermore, a pulse is fed to the transfer wirings 211A on all the rows, to transfer the photoelectrons of the PDs 219 of all the pixels to the FDs 216.

Then, the signals of the FDs 216 are read out row by row. Herein, because one frame period is fixed at a certain constant time period, e.g. ⅓₀ second, the time after having read on all the rows is adjusted by a dummy output or the like.

As mentioned before, the prior art could not have taken an exposure time only in the dummy time period after reading on all the rows. On the contrary, this embodiment can set an exposure time period even during still reading row by row. This is explained in detail in the below.

Herein, a non-exposure time period is assumably taken up to the n-th row of one frame while an exposure time period is taken the duration from then on. Explanation is made on the operation up to the (n−1)-th row, the operation in the n-th row and the operation in the (n+1)-th row and the subsequent, in the order.

(1) Up to (n−1)-th row

When the selecting Tr 213 is turned on, a voltage corresponding to a potential of the FD 216 on the relevant row is outputted onto the vertical signal line 217. This signal is taken to the row signal processing circuit 230 by a sample hold pulse SHD to be supplied to the row signal processing circuit 230. Then, a reset pulse is fed to reset the FD 216 on that row.

Due to this, a voltage corresponding to the potential for resetting the FD 216 is being outputted onto the vertical signal line 217. This is taken again to the row signal processing circuit 230 by a sample hold pulse SHR to be supplied to the row signal processing circuit 230.

Because the difference between those provides a signal, the row signal processing circuit 230 takes a difference and carries out a signal process as mentioned before.

The drain Tr 215 is off during a time period of reading out to the row signal processing circuit 230 and on in the other time period, to exclude the electrons of the PD 219 to the drain. Because the drain Tr 215 has a gate connected to all the pixels as noted before, all the PDs 219 are reset.

(2) On n-th row

The operation of signal reading out is similar to the foregoing. The drain Tr 215 becomes off without exception, at this row as a boundary. From then on, the photoelectrons of the PD 219 are kept accumulated on the PD 219. Thus, an exposure time period comes.

(3) On (n+1)-th row and the subsequent

The operation of signal reading out is similar to the foregoing. Meanwhile, the drain Tr 215 is off at all times.

Figure 5:
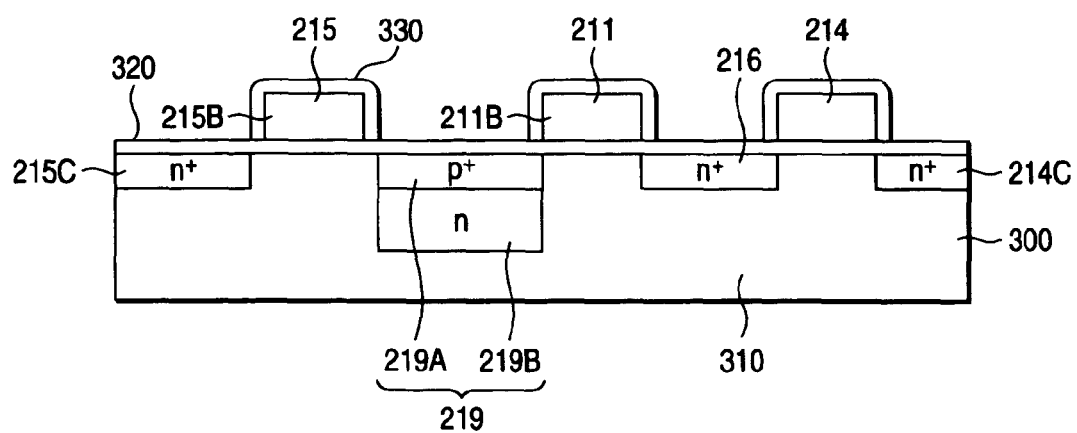
FIG. 5 is a sectional view showing a construction of a PD and its peripheral part of the solid-state imaging device shown in FIG. 2.
Figure 7A:
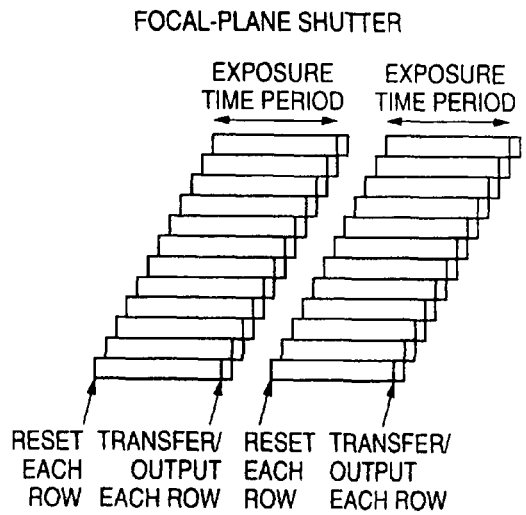
FIG. 7 is an explanatory figure showing two kind examples of shutter and signal-reading operations and output images in the prior art.
Figure 7C:
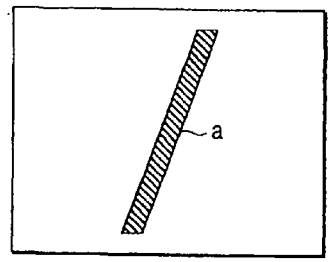
Figure 7B:
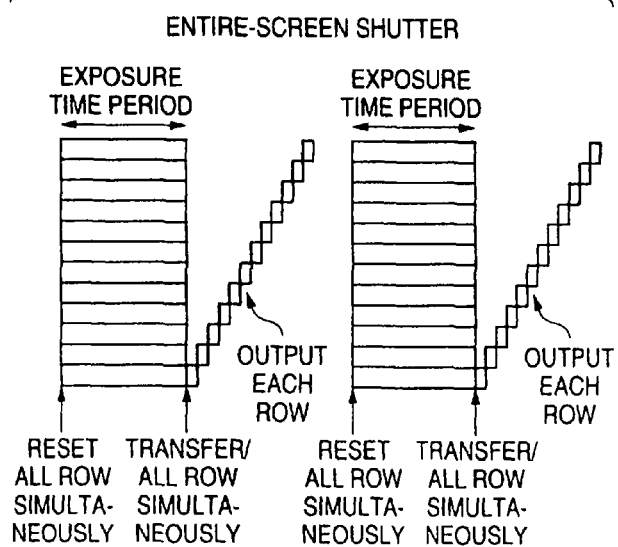
Figure 7D:
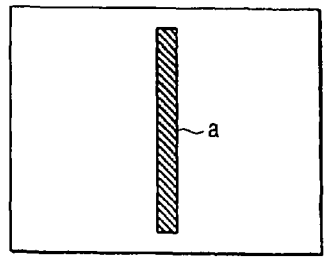
Figure 8:
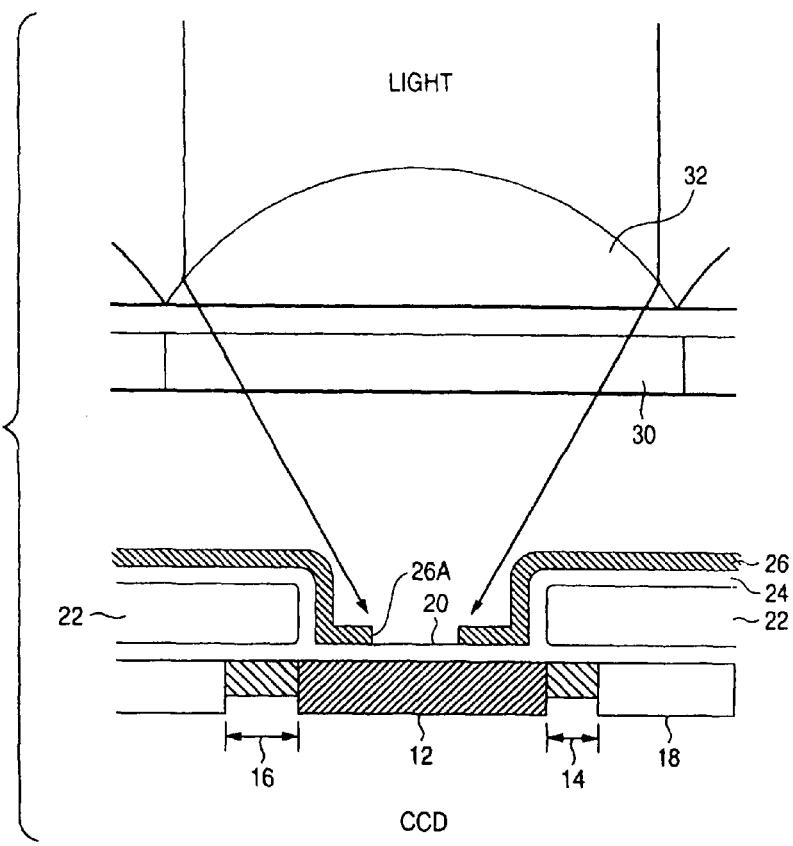
FIG. 8 is a sectional view showing a layered structure of a CCD solid-state imaging device in the prior art.
Figure 9:
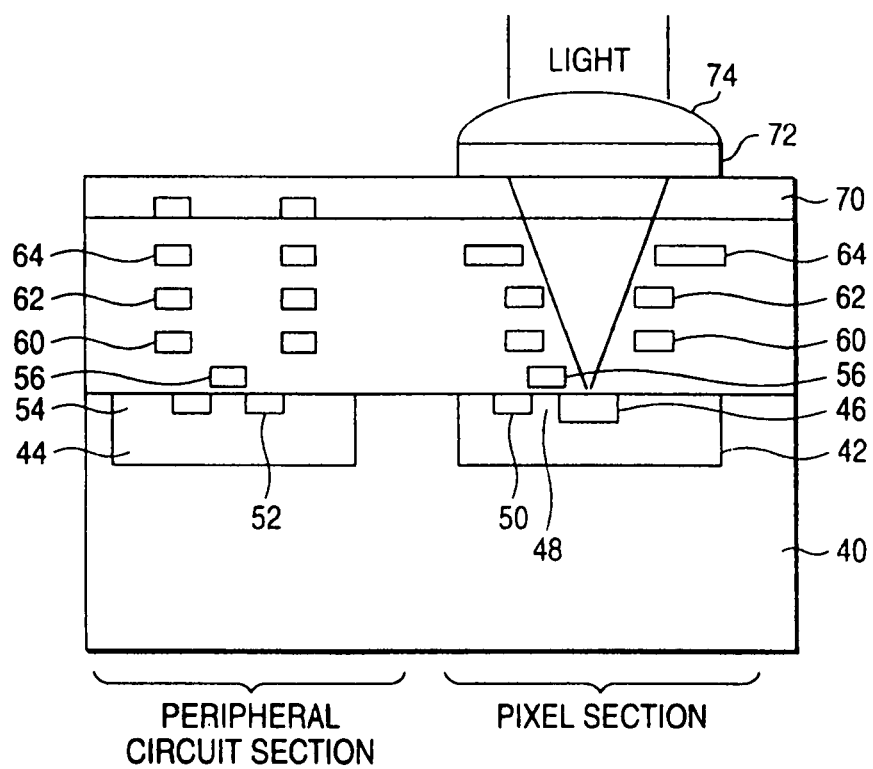
FIG. 9 is a sectional view showing a layered structure of a CMOS solid-state imaging device in the prior art.

FIG. 5 is a sectional view showing a structure of the PD and its peripheral part of the solid-state imaging device of this embodiment.

The solid-state imaging device has various elements formed in a P-well region 310 provided in a silicon substrate 300. In FIG. 5, there is shown a region formed with a PD 219, an FD 216, a transfer Tr 211, a reset Tr 214 and a drain Tr 215.

The PD 219 is made as a buried-type (HAD-structured) PD having a p+ region 219A formed in the extreme surface of the silicon substrate 300 and an n region 219B formed in the underneath layer thereof.

The FD 216 is made by an n+ region formed laterally of the PD 219 through the transfer gate part (transfer Tr 211).

The transfer Tr 211 has a transfer gate part made in an intermediate region between the PD 219 and the FD 216, and a transfer electrode 211B formed by a polysilicon film on the upper surface of the silicon substrate 300 through a gate insulation film 320.

The reset Tr 214 has a reset gate part made in a region on the a side opposite to the transfer Tr 211 of the FD 216, and a reset electrode 214B formed by a polysilicon film on the upper surface of the silicon substrate 300 through the gate insulation film 320. The signal charge on the FD 216 is excluded to the drain 214C. This drain 214C is connected to a wiring for the power source Vdd through a not-shown contact or the like.

The drain Tr 215 has a drain gate made in a region on a side opposite to the transfer Tr 211 of the PD 219, and a drain electrode 215B formed by a polysilicon film on the upper surface of the silicon substrate 300 through the gate insulation film 320. The signal charge on the PD 219 is outputted to the drain 215C. This drain 215C is connected to the wiring for the power source Vdd through a not-shown contact or the like.

Incidentally, although the upper-level layers are provided over the electrodes 211B, 214B, 215B through an insulation film 330, these have no direct bearing on the present invention and hence omitted of explanation.

FIG. 6 is an explanatory figure illustrating the potential transition upon charge reading out on the solid-state imaging device thus structured, showing a potential given positive in a downward direction.

FIG. 6(1) illustrates a potential immediately after resetting all the pixels, wherein photoelectric charge is gradually accumulated on each PD 219. In FIG. 6(2), the transfer Tr 211 is turned on to render a transfer-gate channel voltage as Va, to thereby move the photoelectric charge of the PD 219 to the FD 216.

FIG. 6(3) illustrates a state in a post-transfer non-exposure time, wherein the drain Tr 215 remains off to gradually store photoelectric charge to each PD 219.

Next, FIG. 6(4) illustrates a state the drain Tr 215 is turned on to provide the drain gate with a channel voltage of Vb, thereby outputting the photoelectric charge of the PD 219 to a drain 215C of the drain transistor 215. Note that the transfer Tr 211 and the drain Tr 215 cannot be perfectly matched in their characteristics, thus having different values of Vb and Va (Vb>Va in the illustrated example (downward in FIG. 6)).

The first feature of the present embodiment thus configured lies in that the PD 219 is of an HAD structure and wherein the channel voltage during on of the drain Tr 215 is higher than a potential for depleting the PD 219, enabling to drain nearly all the electrons out of the PD 219. Because this renders the remaining electrons on the PD 219 nearly zero, no great variations occur in the initial state of the PDs 219 even in case there is characteristic variations between the drain Trs 215.

Meanwhile, the second feature lies in that the channel voltage during on of the transfer Tr 211 also is higher than a potential for depleting the PD 219, enabling to transfer nearly all the electrons out of the PD 219. Because this renders the remaining electrons on the PD 219 nearly zero, no great variations occur in the post-transfer state of the PDs 219 even where there is characteristic variations between the transfer Trs 211.

By the two features, the states of the PD 219 at a storage start and after transfer are made nearly the same. Accordingly, despite the both are regulated by the different transistors, preferred image signals are available.

Accordingly, starting an exposure can be regulated by the drain Tr 215 while avoiding image deterioration. As a consequence, exposure can be started even during reading the signals out of the FDs 216 row by row.

Meanwhile, the value of an exposure start row n can be variably controlled depending upon a brightness of a subject. Starting an exposure can be set in any time period within one frame.

Note that, during reading to the column signal processing circuit 230, the drain Tr 215 must be off even in a non-exposure time period. In case it is on in this case, pixel output delicately suffers influence. As a consequence, there arises a slight difference in the output image between the signals of up to the n-th row and of the n-th row and the subsequent, resulting in an appearing horizontal line. In order to prevent this, the drain Tr 215 even in a non-exposure time period is off at least during pixel output, similarly to that in an exposure time period.

In the case of realizing so-called simultaneous shutter that exposure time period at start and end is made simultaneous over the entire screen on a CMOS sensor by the above configuration and operation, the following effects are obtainable.

(1) Even in case the PD is reset in the course of outputting the information on all the rows, image deterioration can be prevented. Accordingly, in the duration from a simultaneous transfer on all the rows to a completion of outputting row by row, the information on all the rows, utilization is possible for an exposure time period while avoiding image deterioration, enabling to raise sensibility owing to a sufficient exposure time period.

(2) During the operation of the above (1), the photographic image can be prevented from interfered by a horizontal line.

(3) Dark current can be greatly reduced by rendering negative a gate voltage of the drain Tr being off, in addition to the transfer Tr.

Incidentally, the above explanation was concerned on the configuration and operation of the CMOS solid-state imaging device provided on the camera apparatus. However, the present invention can be implemented as a single-bodied solid-state imaging device and a control method for same.

Meanwhile, it is possible to selectively use the foregoing all-the-pixel simultaneous shutter operation and the conventional focal-plane shutter operation. Operation keys or the like can be provided as selecting means, for enabling user's selection.

Furthermore, concerning an exposure time period as in the above, operation keys or the like can be provided as selecting means, for enabling user's suitable selection. Depending upon an exposure time period selected by the user, it is possible to carry out control in a manner of selecting a start row of exposure as mentioned above.

As explained above, in the solid-state imaging device of the invention and control method for same, there is provided a drain transistor for discharging the signal charge of a buried-type photodiode separately from a transfer transistor for transferring to a floating diffusion part the signal charge of a buried-type photodiode as a photoelectric conversion element on each pixel. By setting both the channel potential on the turned-on drain transistor and the channel potential on the turned-on transfer transistor higher than a potential for depleting the photodiode, the signal charge of the photodiode can be completely transferred from both the transfer transistor and the drain transistor.

Accordingly, in the operation of sequentially reading signal charges on a pixel-row unit basis from the floating diffusion part after carrying out an all-the-pixel simultaneous shutter operation and transfer operation in order for shooting a moving subject without inclination, photodiode exposure operation can be started in a course of the reading operation. This can secure a sufficient exposure time with swift operation, thereby realizing sensitive, preferred image output. Meanwhile, securing a sufficient exposure time can relatively reduce the amount of a noise due to light leak. In also this respect, preferred image output can be realized.

Meanwhile, in a camera apparatus mounting such a solid-state imaging device, sensitive preferred image output can be similarly realized while securing a sufficient exposure time.

Incidentally, the foregoing "complete depletion" and "complete transfer" do not require a completeness in a literal sense, wherein the term "complete" was used as an ideal state. The remaining charge is allowed to exist within a range not to pose a problem of noise.

In addition, the solid-state imaging device is not limited to a device in the form of one chip but may be a chip for signal processing or a camera module device having a desired optical system.

What is claimed is:

1. A solid-state imaging device comprising an imaging region section provided with a plurality of pixels and a processing circuit section for processing an image signal output from the imaging region section, wherein:
   (a) each pixel comprises
      (1) a photoelectric converting element which generates a signal charge commensurate with a light-receiving amount,
      (2) a charge holding region of a conductivity type which holds the signal charge,
      (3) a transfer transistor, coupled to one side of the photoelectric converting element and the charge holding region, which transfers the signal charge generated by the photoelectric converting element to the charge holding region, and
      (4) a drain transistor, coupled to another side of the photoelectric converting element and a drain line, which drains the signal charge generated by the photoelectric converting element, and
   (b) the solid state imaging device further comprises a driver configuration unit configured to apply a negative voltage to the drain transistor during an off state of a transfer gate electrode so as to suppress a dark current to the photoelectric converting element.

2. A solid-state imaging device according to claim 1, wherein each pixel has a reset transistor for resetting the charge holding region with a signal charge, an amplifying transistor for outputting an electric signal corresponding to a potential on the charge holding region, and a selecting transistor for selectively activating the amplifying transistor.

3. A solid-state imaging device according to claim 2, wherein, for each pixel the transfer transistor, the reset transistor and the amplifying transistor have respective gate wirings provided in a direction along the pixel row, to be driven on a pixel-row basis and the drain transistor has a gate wiring provided in a direction along the pixel column, the drain transistor gate wiring being short-circuited common between all the pixels at an outside of the imaging region section.

4. A solid-state imaging device according to claim 1, configured so that after simultaneously resetting at least one floating diffusion part on all the pixels in the imaging region section, signal charges of the photodiodes on all the pixels are simultaneously transferred to the charge holding regions, next the signal charges transferred to the charge holding regions are read out on a pixel-row basis, to keep the drain transistor on until the reading operation proceeds to a predetermined exposure start row and drain the signal charges of the photodiodes on all the pixels, and to turn off the drain transistor when proceeded to the predetermined exposure start row and start an exposure on all the pixels.

5. A solid-state imaging device according to claim 4, configured so that, for each pixel the photodiode, immediately after transferring the signal charge of the photodiode to the charge holding region by the transfer transistor, has remaining charges of 20 or less while the photodiode, immediately after draining the signal charge of the photodiode by the drain transistor, has remaining charges of 20 or less.

6. A solid-state imaging device according to claim 4, wherein, for each pixel the drain transistor being on has a gate voltage level higher than a power voltage of a digital circuit mounted on the solid-state imaging device.

7. A solid-state imaging device according to claim 4, wherein, for each pixel the drain transistor is off during an operation to read out the signal charge of the charge holding region on a pixel row preceding to the exposure start row.

8. A camera apparatus for outputting an image taken by a solid-state imaging device, the camera apparatus comprising the solid-state imaging device having an imaging region section provided with a plurality of pixels and a processing circuit section for processing an image signal output from the imaging region section, wherein:
   (a) each pixel comprises
      (1) a photoelectric converting element which generates a signal charge commensurate with a light-receiving amount,
      (2) a charge holding region formed by a conductivity type impurity layer in a layer beneath a charge separating region which holds the signal charge,
      (3) a transfer transistor which transfers the signal charge generated by the photoelectric converting element to the charge holding region, and
      (4) a drain transistor which drains a signal charge generated by the photoelectric converting element; and
   (b) the solid state imaging device further comprising a driver configuration unit configured to apply a negative voltage to the drain transistor during an off state of a transfer gate electrode so as to suppress a dark current to the photoelectric converting element.

9. A camera apparatus according to claim 8, wherein, for each pixel the solid-state imaging device further has a reset transistor for resetting the charge holding region with a signal charge, an amplifying transistor for outputting an electric signal corresponding to a potential on the charge holding region, and a selecting transistor for selectively activating the amplifying transistor.

10. A camera apparatus according to claim 9, wherein, in the solid-state imaging device, for each pixel the transfer transistor, the reset transistor and the amplifying transistor have respective gate wirings provided in a direction along the pixel row, to be driven on a pixel-row basis and the drain transistor has a gate wiring provided in a direction along the pixel column, the drain transistor gate wiring being short-circuited common between all the pixels at an outside of the imaging region section.

11. A camera apparatus according to claim 8, wherein, in the solid-state imaging device, after simultaneously resetting the charge holding regions on all the pixels in the imaging region section, signal charges of the photodiodes on all the pixels are simultaneously transferred to the charge holding regions, next the signal charges transferred to the charge holding regions are read out on a pixel-row basis, to keep the drain transistor on until the reading operation proceeds to a predetermined exposure start row and drain the signal charges of the photodiodes on all the pixels, and to turn off the drain transistor when proceeded to the predetermined exposure start row and start an exposure on all the pixels.

12. A camera apparatus according to claim 11, wherein, in the solid-state imaging device, for each pixel the photodiode, immediately after transferring the signal charge of the photodiode to the charge holding region by the transfer transistor, has remaining charges of 20 or less while the photodiode, immediately after draining the signal charge of the photodiode by the drain transistor, has remaining charges of 20 or less.

13. A camera apparatus according to claim 11, wherein, in the solid-state imaging device, for each pixel the drain transistor being on has a gate voltage level higher than a power voltage of a digital circuit mounted on the solid-state imaging device.

14. A camera apparatus according to claim 11, wherein, in the solid-state imaging device, for each pixel the drain transistor is off during an operation to read out the signal charge of the charge holding region on a pixel row preceding to the exposure start row.

15. A camera apparatus according to claim 11, further having exposure time selecting means for selecting an exposure time of the solid-state imaging device and exposure start row selecting means for selecting the predetermined exposure start row depending upon an exposure time selected by the exposure time selecting means.

16. A camera apparatus according to claim 8, further having switch means for switching a shutter operation of the solid-state imaging device between a focal-plane shutter operation and an all-the-pixel simultaneous shutter operation.

17. A solid-state imaging device comprising:
a plurality of pixels each pixel having (a) a light-receiving part, (b) a transfer transistor which reads out a charge generated in the light-receiving part, (c) a drain transistor which drains the charge generated in the light-receiving part, and (d) a charge holding region of a conductivity type which holds the charge; and
a driver configuration unit configured to apply a negative voltage to the drain transistor during an off state of a transfer gate electrode so as to suppress a dark current to the light receiving part.

18. A solid-state imaging device according to claim 17, wherein the charge holding region when substantially depleted includes charges (electrons or charges) in the number of 20 or less.

19. A solid-state imaging device according to claim 17, wherein
each pixel further has a charge holding part for holding the charge read out by the transfer transistor,
the charges stored in the charge storing regions are read out, simultaneously on all the pixels, to the charge holding parts by the transfer transistors,
the charges held at the charge holding parts of the plurality of pixels are read out as pixel signals in a predetermined order, and
the plurality of pixels, in a time period which the pixel signals are read out, are drained of unwanted charges in the charge storing regions by the drain transistors, thereby starting an exposure time period.

20. A solid-state imaging device comprising:
a plurality of pixels, each pixel having (a) a light-receiving part, (b) a transfer transistor which reads out a charge generated by the light-receiving part in a manner substantially depleting a charge storing region included in the light-receiving part, (c) a drain transistor which drains the char generated by the light-receiving part, and (d) the charge holding region of a conductivity type which holds the charge; and
a driver configuration unit configured to apply a negative voltage to the drain transistor during an off state of a transfer gate electrode so as to suppress a dark current to the light receiving part.

21. A solid-state imaging device according to claim 20, wherein the charge holding region when substantially depleted includes charges (electrons or charges) in the number of 20 or less.

22. A solid-state imaging device comprising an imaging region section provided with a plurality of pixels and a processing circuit section for processing an image signal output from the imaging region section, wherein:
(a) each pixel comprises
(1) a photoelectric converting element for generating a signal charge commensurate with a light-receiving amount,
(2) a charge holding region of a conductivity type which holds the signal charge,
(3) a transfer transistor which transfers the signal charge generated by the photoelectric converting element to the charge holding region,
(4) a drain transistor which drains the signal charge generated by the photoelectric converting element, and
(5) a reset transistor which resets the charge holding region with the signal charge, an amplifying transistor which outputs an electric signal corresponding to a potential on the charge holding region, and a selecting transistor which selectively activates the amplifying transistor,
(b) a driver configuration unit configured to apply a negative voltage to the drain transistor during an off state of a transfer gate electrode so as to suppress a dark current to the photoelectric converting element; and
(c) the solid-state imaging device is configured so that after simultaneously resetting the charge holding regions on all the pixels in the imaging region section, signal charges of the photodiodes on all the pixels are simultaneously transferred to the charge holding regions, next the signal charges transferred to the charge holding regions are read out on a pixel-row basis, to keep the drain transistor on until the reading operation proceeds to a predetermined exposure start row and to drain the signal charges of the photodiodes on all the pixels.

23. A solid-state imaging device having an imaging region section provided with a plurality of pixels and a processing circuit section for processing an image signal outputted from the imaging region section, wherein:

(a) each pixel comprises
  (1) a photoelectric converting element which generates a signal charge commensurate with a light-receiving amount,
  (2) a charge holding region of a conductivity type which holds the signal charge,
  (3) a transfer transistor which transfers the signal charge generated by the photoelectric converting element to the charge holding region,
  (4) a drain transistor which drains the signal charge generated by the photoelectric converting element, and
  (5) a reset transistor which resets the charge holding region with the signal charge, an amplifying transistor which outputs an electric signal corresponding to a potential on the charge holding region, and a selecting transistor which selectively activates the amplifying transistor,
(b) a driver configuration unit configured to apply a negative voltage to the drain transistor during an off state of a transfer gate electrode so as to suppress a dark current to the photoelectric converting element,
(c) the solid-state imaging device is configured so that after simultaneously resetting the charge holding regions on all the pixels in the imaging region section, signal charges of the photodiodes on all the pixels are simultaneously transferred to the charge holding regions, next the signal charges transferred to the charge holding regions are read out on a pixel-row basis, to keep the drain transistor on until the reading operation proceeds to a predetermined exposure start row and to drain the signal charges of the photodiodes on all the pixels; and
(d) for each pixel, the drain transistor is off during an operation to read out the signal charge of the charge holding region on a pixel row preceding the exposure start row.

* * * * *